United States Patent

Khoury et al.

Patent Number: 5,814,733
Date of Patent: Sep. 29, 1998

[54] METHOD OF CHARACTERIZING DYNAMICS OF A WORKPIECE HANDLING SYSTEM

[75] Inventors: Theodore A. Khoury; Greg A. Katrenick; Richard O'Connell, all of Austin, Tex.

[73] Assignee: Motorola, Inc., Schaumburg, Ill.

[21] Appl. No.: 713,271

[22] Filed: Sep. 12, 1996

[51] Int. Cl.⁶ .......................... G01H 11/08; G01R 31/01; G01R 31/02; G01R 31/26
[52] U.S. Cl. ................ 73/658; 364/468.16; 364/474.19; 364/552; 324/754; 324/765
[58] Field of Search .............................. 73/649, 650, 651, 73/652, 653, 654, 655, 656, 657, 658, 659, 660, 661; 364/468.01, 468.16, 468.17, 474.17, 474.19, 552, 566; 324/72.5, 754, 755, 756, 757, 758, 765

[56] References Cited

U.S. PATENT DOCUMENTS

| | | | |
|---|---|---|---|
| 4,595,282 | 6/1986 | Takahashi | 355/53 |
| 4,931,962 | 6/1990 | Palleiko | 364/550 |
| 4,976,415 | 12/1990 | Murai et al. | 248/550 |
| 5,444,637 | 8/1995 | Smesny et al. | 364/556 |
| 5,506,786 | 4/1996 | Itoh et al. | 364/474.17 |
| 5,511,005 | 4/1996 | Abbe et al. | 364/552 |
| 5,579,084 | 11/1996 | Takahashi et al. | 355/53 |

OTHER PUBLICATIONS

Hewlett–Packard Co; "Signal Analyzers"; Test & Measurement Catalog, pp. 226–230; (1983).

*Primary Examiner*—Hezron E. Williams
*Assistant Examiner*—Rose M. Miller
*Attorney, Agent, or Firm*—J. Gustav Larson

[57] ABSTRACT

A method of characterizing dynamics of a workpiece handling system includes providing a workpiece or substrate (14), supporting the substrate (14) with a workpiece handler (13), providing a motion for the workpiece handler (13), transforming the motion into a signal, converting the electrical signal into a measurement of distance, and using the measurement of distance to determine a vibration in the motion.

8 Claims, 4 Drawing Sheets

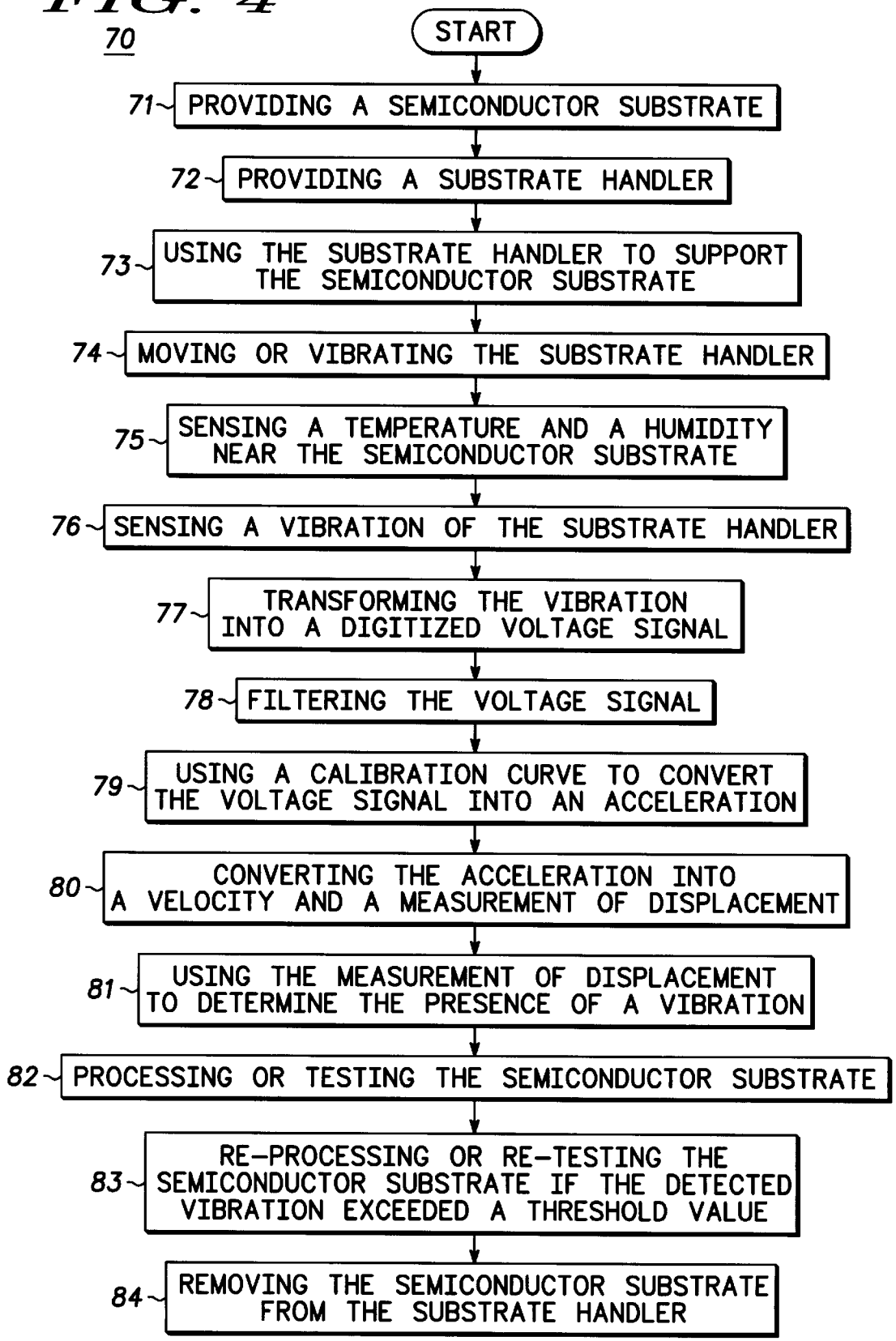

METHOD OF CHARACTERIZING DYNAMICS OF A WORKPIECE HANDLING SYSTEM

BACKGROUND OF THE INVENTION

This invention relates, in general, to the handing of workpieces, and more particularly, to a method of characterizing the dynamics of a workpiece handling system.

Many components within a semiconductor wafer prober produce vibrations that can invalidate semiconductor device test results by degrading an electrical contact between a semiconductor device and probe needles of a probe card. For example, stepper motors in a semiconductor wafer prober move a wafer chuck that supports the semiconductor device during testing. However, the stepper motors generate vibrations and can transmit the vibrations to the wafer chuck because of the proximity between the wafer chuck and the stepper motors. The vibrations in the wafer chuck can invalidate test results for the semiconductor device by causing a poor, intermittent, or inconsistent electrical contact between the semiconductor device and the probe needles. As another example, many testers also include fans that generate additional vibrations, which can also degrade the electrical contact between the probe needles and the semiconductor device. Moreover, vibrations from the floor that supports the tester can also degrade the electrical test results.

Accordingly, a need exists for a method of characterizing the dynamics of a workpiece handling system. The method should provide real-time data during processing or testing of the workpiece, and the method should also be cost-effective and simple to implement.

BRIEF DESCRIPTION OF THE DRAWINGS

FIG. 4 depicts a flow chart outlining a method of electrically testing a semiconductor device in accordance with the present invention.

DETAILED DESCRIPTION OF THE DRAWINGS

Figure 1:
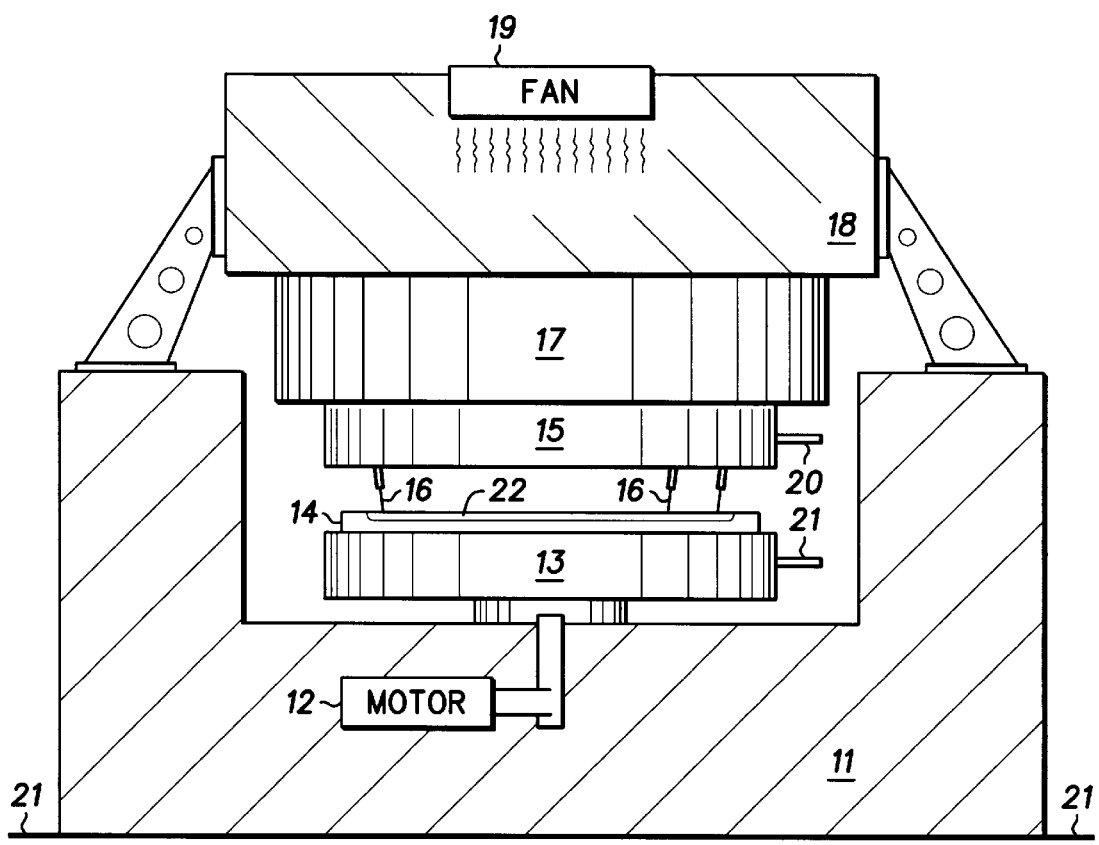
FIG. 1 illustrates a cross-sectional schematic view of a semiconductor device tester in accordance with the present invention.

FIG. 1 illustrates a cross-sectional schematic view of a semiconductor device tester 10. Tester 10 includes a base 11 that houses a motor 12 and that supports a substrate handler 13 wherein base 11 is supported by a floor 21. Motor 12 is coupled to and moves handler 13, which is known in the art as a wafer chuck. Handler 13 has a plurality of axes of mobility wherein each of the plurality of axes can be orthogonal to each other. For example, handler 13 can have three orthogonal axes of mobility that are similar to X, Y, and Z axes of a conventional Cartesian coordinate system. Motor 12 and handler 13 can represent any workpiece handler or workpiece handling system known to those skilled in the art. Base 11 also supports a test head 18 that houses a fan 19 and that supports an interface 17. Fan 19 dissipates heat within test head 18, and interface 17 supports a removable probe card 15 that includes a plurality of probe needles 16.

A workpiece or semiconductor substrate 14 is disposed over or is supported by handler 13. Substrate 14 has a component or semiconductor device 22. Because device 22 can have many different structures, the depicted structure is only for the purpose of illustrating device 22. It is understood that substrate 14 can include a plurality of devices similar to device 22, and it is further understood that handler 13 can support a plurality of substrates similar to substrate 14. Probe needles 16 physically and electrically couple probe card 15 to device 22. Probe card 15 assists in electrically testing or probing device 22 to verify proper electrical operation of device 22. Probe card 15 can simultaneously test a plurality of devices.

Vibrations within a conventional prior art tester degrade the electrical contact between devices and probe needles, and the degradation of the electrical contact can invalidate the electrical test results for the devices. The vibrations can originate from many different sources. For example, the operation of a stepper motor or fan generates vibrations in the tester, and the vibrations can be conducted, transmitted, or transferred to a wafer handler or probe card because of the proximity between the motor, wafer handler, probe card, and fan. Other vibrations within the tester can originate from a floor, which supports the tester. For example, a person walking on the floor can induce additional vibrations within the tester. Furthermore, vibrations from an adjacent tester, which is also supported by the floor, can provide additional vibrations. The tester can include conventional dampening systems to reduce the transmission of vibrations within the tester, but the dampening systems cannot attenuate all of the vibrations within the tester.

Tester 10 includes sensors to detect, sense, or monitor any vibrations within tester 10 that can affect the electrical contact between device 22 and probe needles 16 of probe card 15. As an example, tester 10 has a dynamic sensor 21 for sensing vibrations in handler 13. Sensor 21 transforms the motion or acceleration of handler 13 into a voltage signal. Sensor 21 is preferably removably coupled, clamped, mounted, or adhered to handler 13 to facilitate replacing or servicing sensor 21. For example, many wafer chucks have tapped holes along their side surfaces that can be used to rigidly mount sensor 21. However, sensor 21 can alternatively be integrated within handler 13. The placement or location of sensor 21 should not impede the movement of handler 13 and should not impede the ability of handler 13 to properly support substrate 14. When handler 13 has three orthogonal axes of mobility, sensor 21 is preferably a tri-axial accelerometer that has three orthogonal axes of sensitivity to measure acceleration along the three orthogonal axes of mobility of handler 13. In this example, each of the three axes of sensitivity for sensor 21 should be substantially parallel to a different one of the three axes of mobility for handler 13. Alternatively, if sensor 21 only has a single axis of sensitivity, then a plurality of the single-axis sensors can be coupled to handler 13 wherein the axis of sensitivity for each of the sensors is mounted along a different axis of mobility for handler 13.

Tester 10 can also have a sensor 20, which can be similar to dynamic sensor 21, for detecting vibrations in probe card 15. Alternatively, sensor 20 can be a static sensor for detecting or monitoring temperature or humidity near substrate 14 and probe card 15. One skilled in the art will understand that temperature fluctuations can alter the electrical performance of device 22 and that humidity fluctuations can corrode device 22 and probe needles 16, which can degrade the electrical contact between device 22 and probe card 15. Sensor 20 is preferably removably coupled to probe card 15 to facilitate replacing or servicing sensor 20. However, sensor 20 can also be integrated within probe card 15. The operation of temperature and humidity sensors is well known to those skilled in the art.

Figure 2:
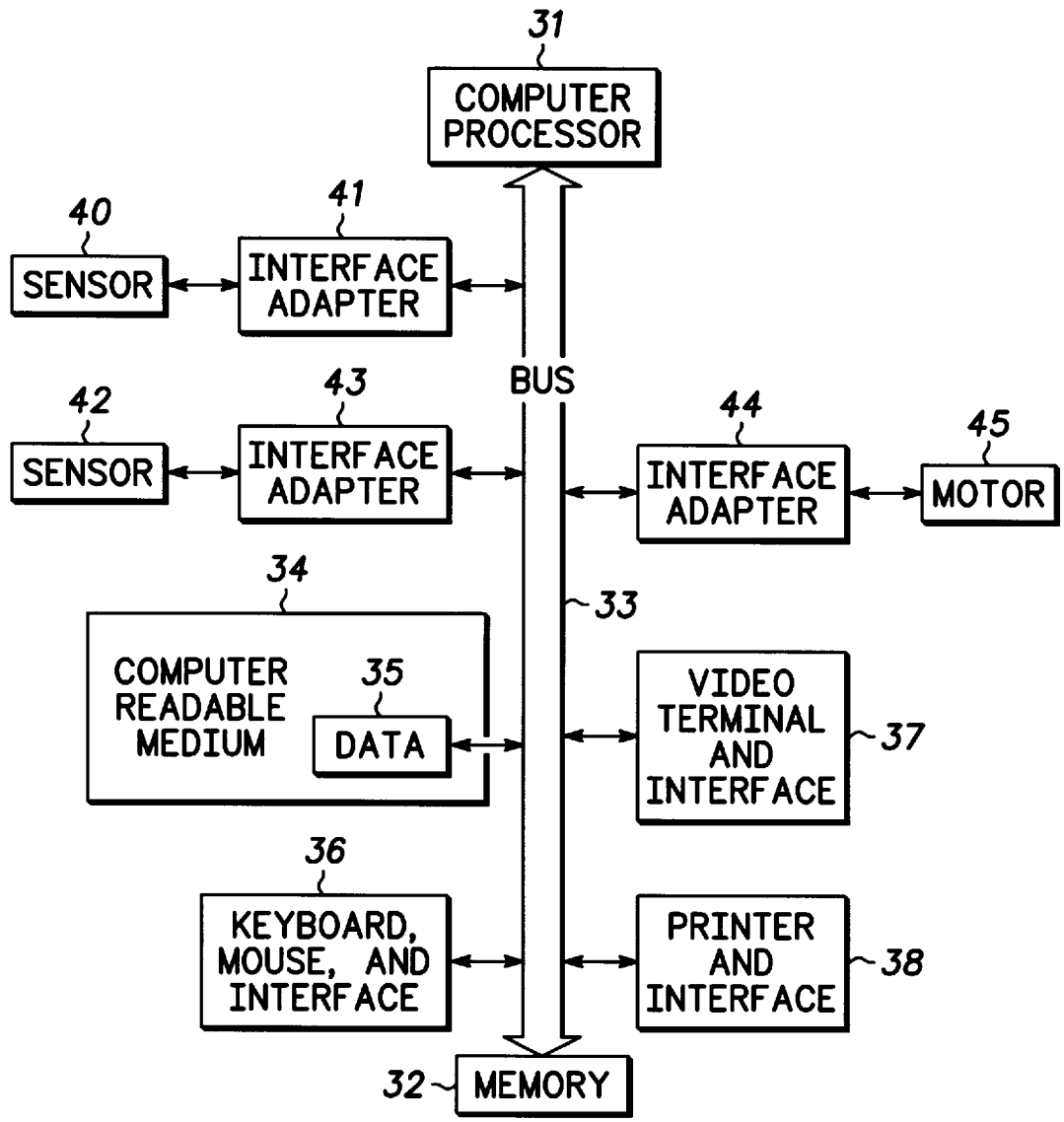
FIG. 2 portrays a block diagram view of an electronic system for characterizing the dynamics of the semiconductor device tester in accordance with the present invention.

FIG. 2 portrays a block view of an electronic system 30 for characterizing the dynamics of tester 10 of FIG. 1 and for controlling the movement of handler 13 in FIG. 1. System 30 can also be used as a diagnostic tool for tester 10, can be used for preventative maintenance, and can provide real-time statistical process control during manufacturing. System 30 includes a computer processor 31 coupled to a memory 32 by a data bus 33. Examples of memory 32 include, but are not limited to, dynamic random access memories (DRAMs), static random access memories (SRAMs), erasable programmable memories (EPROMs), and electrically erasable programmable memories (EEPROMs). Processor 31 can be a conventional microprocessor or microcontroller. Processor 31 can be used to control the motion or movement of handler 13 of FIG. 1. Bus 33 is configured to receive inputs from a computer readable medium 34, a keyboard, mouse, and appropriate input interface 36, and interface adaptors 41 and 43, as known in the art. Medium 34 contains data 35, and examples of medium 34 include, but are not limited to, magnetic tapes, floppy disks, and compact discs. Bus 33 is also configured to deliver outputs for a video terminal and appropriate output interface 37, a printer and appropriate output interface 38, and interface adaptor 44, as known in the art.

A motor 45 receives inputs from and is controlled by interface adaptor 44 and processor 31. Motor 45 can be similar to motor 12 of FIG. 1. Adaptor 44 and its use are well known to those skilled in the art. Interface adaptors 41 and 43 receive inputs from sensors 40 and 42, respectively, wherein sensors 40 and 42 can be similar to sensors 20 and 21, respectively, of FIG. 1. Sensor 42, adaptor 43, and processor 31 should be able to provide a sampling frequency or rate of at least ten times the frequency of the vibration to be sensed or monitored in order to provide an accurate measurement of the vibration. Many vibrations that can degrade an electrical contact during testing are typically below approximately three hundred hertz. Accordingly, sensor 42, adaptor 43, and processor 31 should provide a sampling frequency of approximately three thousand hertz or higher.

Specific examples for individual components of system 30 are provided only for the purpose of facilitating the explanation of system 30 and are not provided to limit the present invention. Computer processor 31, memory 32, and bus 33 can be a portion of a personal computer or the like. Sensor 40 can be a humidity or temperature sensor sold by Omega Engineering, Incorporated of Stamford, Conn. Adaptor 41 can be electrically coupled to a serial port of the personal computer and can be comprised of a sixteen channel backplane board sold by National Instruments of Austin, Tex. Sensor 42 can be a piezoelectric tri-axial accelerometer sold by Pico-Coulumb Piezotronics of Depew, N.Y. Adaptor 43 can be electrically coupled to another serial port of the personal computer and can be comprised of a simultaneous sample and hold board and an analog-to-digital converter sold by National Instruments of Austin, Tex.

Figure 3:
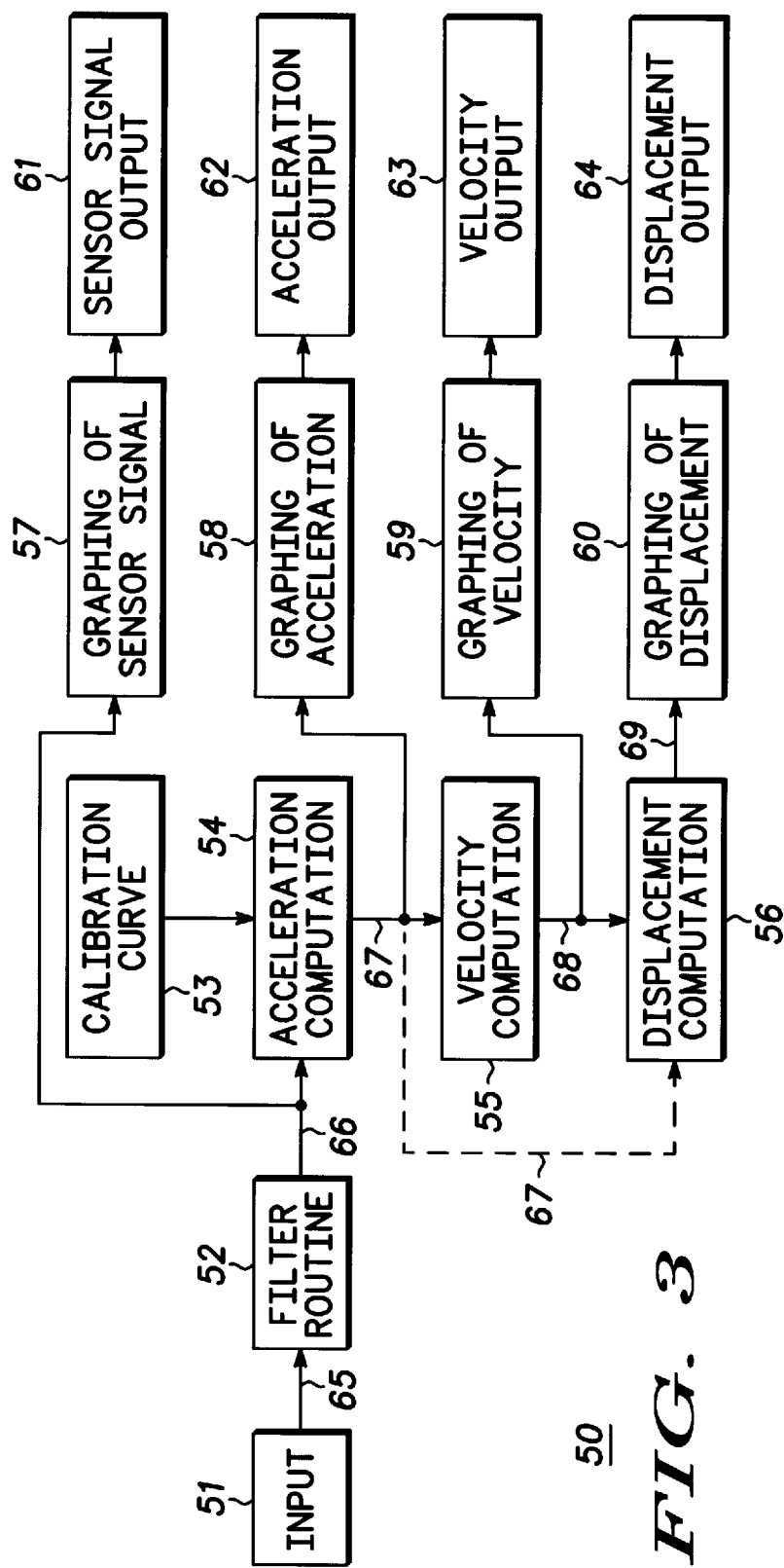
FIG. 3 represents a flow diagram of a method for controlling the electronic system in accordance with the present invention.

FIG. 3 represents a method for controlling system 30. The method can be implemented by software or computer program 50 used by system 30 of FIG. 2. Program 50 can be stored in data 35 of FIG. 2 or in memory 32 of FIG. 2. Processor 31 of FIG. 2 executes program 50 to monitor and determine the presence of a vibration in tester 10 near substrate 14 (FIG. 1). Program 50 can be executed by processor 31 before, during, or after processing, probing, or testing substrate 14.

Program 50 has an input 51, which receives an electrical signal, such as a voltage signal or a current signal from a sensor in tester 10 (FIG. 1). As an example, sensor 21 (FIG. 1) or sensor 42 (FIG. 2) can transform a vibration of handler 13 (FIG. 1) into a voltage signal, which can be digitized by adaptor 43 and which is received by input 51. When sensor 21 is a tri-axial accelerometer, input 51 receives three voltage signals or one voltage signal for each axis of sensitivity of the accelerometer. Alternatively, input 51 can receive a plurality of voltage signals from a plurality of sensors. To facilitate the explanation of program 50, the remaining description is described in relationship to input 51 receiving a single voltage signal. However, it is understood that program 50 can simultaneously process a plurality of voltage signals.

Input 51 transmits the voltage signal as a voltage signal 65 to an optional filter routine 52, which filters or refines signal 65 to produce a filtered voltage signal 66. A person operating tester 10 (FIG. 1) or system 30 (FIG. 2) can determine the appropriate parameters for filter routine 52. For example, the operator of system 30 can determine the type of filter to use, the polynomial order of the filter, and cutoff frequencies for the filter. Band pass or high pass filters are typically used for monitoring vibrations, but low pass filters can also be used. The polynomial order of the band pass or high pass filter is typically less than seven for monitoring vibrations. A low cutoff frequency for vibration monitoring can be approximately ten hertz or lower, and a high cutoff frequency for vibration monitoring can be approximately one thousand hertz or higher. A different filter can be used for each axis of sensitivity of sensor 21, and the filter parameters can be individually chosen for each of the axes of sensitivity. One skilled in the art will be able to use keyboard, mouse, and interface 36 (FIG. 2) to pick, select, or enter the appropriate filter parameters for program 50 based upon the types of vibrations to be monitored. Properly chosen filter parameters can reduce the minimum sampling frequency required for the vibration sensor of tester 10 (FIG. 1).

After signal 65 is converted to filtered signal 66, a calibration curve 53 is used to convert signal 66 into a measurement of acceleration of handler 13 (FIG. 1) as represented by an acceleration signal 67. Calibration curve 53 can be part of program 50 or can alternatively be stored in memory 32 or data 35 (FIG. 2) and used by processor 31 (FIG. 2). A section 54 of program 50 computes or determines acceleration signal 67 from calibration curve 53 and signal 66. Alternatively, section 54 can use an unfiltered signal or signal 65, instead of filtered signal 66, to produce acceleration signal 67.

Signal 67 can be integrated by a routine, subprogram, or section 55 to compute or determine a measurement of velocity of handler 13 (FIG. 1) as represented by a velocity signal 68. Then, signal 68 can be integrated by a routine, subprogram, or section 56 to compute or determine a measurement of distance or displacement of handler 13 (FIG. 1) as represented by a displacement signal 69. Alternatively, acceleration signal 67 can be integrated twice by section 56 to directly convert signal 67 into displacement signal 69. This alternative embodiment is illustrated as a dashed line in FIG. 3.

A sensor graphing subprogram or routine 57 receives filtered signal 66 and displays, plots, or graphs signal 66 in an output 61. When filter routine 52 is not used in program 50, sensor graphing routine 57 can alternatively receive and display unfiltered or raw signal 65. An acceleration graphing subprogram or routine 58 receives acceleration signal 67 and displays, plots, or graphs signal 67 in an output 62. Similarly, graphing subprograms or routines 59 and 60 receive signals 68 and 69, respectively, and display, plot, or graph signals 68 and 69 in outputs 63 and 64, respectively. Outputs 61, 62, 63, and 64 can be displayed on video terminal and interface 37 (FIG. 2) or can be printed out on printer and interface 38 (FIG. 2). Outputs 61, 62, 63, and 64 can also be saved to a file in memory 32 or data 35.

Acceleration signal 67 is computed in the time domain using calibration curve 53. The computations or calculations of sections 55 and 56 can be performed in the time domain or in the frequency domain. Similarly, the vibrations detected by sensor 21 (FIG. 1) can be represented as an acceleration, velocity, or displacement in the time or frequency domain in outputs 62, 63, and 64. When the frequency domain data is displayed in outputs 62, 63, and 64, the frequency of a particular vibration detected by sensor 21 can be determined, and the frequency of the vibration can be related to a source of the vibration for diagnostic purposes. For example, a vibration or oscillation at a particular frequency can be correlated to the oscillation frequency of fan 19 (FIG. 1). When the time domain data is displayed in outputs 62, 63, and 64, the time or duration of the occurrence of the vibration detected by sensor 21 can also be related to a source of the vibration for diagnostic purposes. For example, a periodic vibration can be correlated to a person walking on floor 23 (FIG. 1) nearby tester 10 (FIG. 1).

All of outputs 62, 63, and 64 are used to determine the presence and severity of a vibration. For the purposes of the following examples, the data in outputs 62, 63, and 64 is plotted in the frequency domain on video terminal and interface 37 of FIG. 2. If output 62 shows an acceleration at a frequency and if output 63 shows a velocity at the same frequency but output 64 shows an insignificant amount of displacement at the same frequency, then the vibration in handler 13 has a small magnitude or amplitude, and the vibration will have an insignificant effect upon the electrical contact between probe card 15 and substrate 14 (FIG. 1). As a second example, if outputs 62, 63, and 64 show significant amounts of acceleration, velocity, and displacement, respectively, at a common frequency, then a vibration exists in handler 13, and the electrical contact between substrate 14 and probe card 15 can be detrimentally affected. In this second example, a larger displacement in output 64 indicates a more severe vibration and a potentially worse electrical contact.

FIG. 4 depicts a flow chart 70 outlining a method of electrically testing a component or device 22 as described hereinbefore with reference to FIGS. 1, 2, and 3. A semiconductor substrate such as, for example, substrate 14 (FIG. 1) is provided in a step 71 of flow chart 70, and a substrate handler such as, for example, handler 13 (FIG. 1) is provided is a step 72. The substrate handler is used to support the semiconductor substrate during a step 73, and a vibration source such as, for example, motor 12 or fan 19 (FIG. 1) is used to provide a motion or vibration for the substrate handler during a step 74. Then, a temperature and humidity near the semiconductor substrate are sensed or monitored in a step 75, and in a step 76, a vibration near the substrate handler and semiconductor substrate is sensed or monitored with an accelerometer or other suitable sensor such as, for example, sensors 20 or 21 of FIG. 1 or sensors 40 or 42 of FIG. 2. Next, the sensor transforms or converts the vibration into a digitized voltage signal during a step 77. Then, the voltage signal is converted into a measurement of the vibration during steps 78, 79, 80, and 81. First, a filtering routine such as, for example, routine 52 (FIG. 3) filters the voltage signal in step 78. Second, a calibration curve such as, for example, calibration curve 53 (FIG. 3) can be used to convert or transform the voltage signal into an acceleration in step 79, which can be performed by, for example, section 54 of program 50 in FIG. 3. Then, the acceleration can be converted or transformed into a velocity and a measurement of displacement in step 80, which can be performed by, for example, sections 55 and 56 of program 50 in FIG. 3. The acceleration, velocity, and measurement of displacement are used to determine the presence of a vibration near the semiconductor substrate during step 81. Next, the semiconductor substrate is processed or tested in a step 82. Then, as indicated in a step 83, the semiconductor substrate can be re-processed or re-tested if the vibration of step 81 exceeds a predetermined threshold value. Subsequently, the semiconductor substrate can be removed from the substrate handler in a step 84 after satisfactory processing of the semiconductor substrate is achieved.

It is understood that steps 75 through 83 can occur simultaneously to provide a real-time analysis of vibrations during processing of the semiconductor substrate. It is also understood that steps 76 through 81 can be used to determine or predict when tester 10 (FIG. 1) requires maintenance. For instance, if vibrations are continuously detected over an extended period of time, then probe card 15 or other portions of tester 10 may require planarization, alignment, or replacement. It is further understood that steps 74 through 84 can be controlled by a single computer system such as, for example, system 30 of FIG. 2 to simplify implementation and to reduce the cost for manufacturing a semiconductor device.

Therefore, it is apparent there has been provided an improved method of characterizing the dynamics of a workpiece handling system that overcomes the disadvantages of the prior art. Vibrations that can degrade an electrical contact between a semiconductor device and a probe card are monitored and characterized. Sources of the vibrations can be identified, and appropriate corrective measures can be taken. The method described herein provides real-time statistical process control during the manufacturing process. The method described herein also provides a method of predicting or determining when a probe card or tester requires maintenance. The present method can also reduce the cost of the manufacturing process by reducing the number of discarded devices. For example, the present method can identify when bad electrical test results may be due to poor electrical contact instead of bad devices. Therefore, good devices that were discarded in the past may be saved and re-tested.

While the invention has been particularly shown and described with reference to preferred embodiments, it will be understood by those skilled in the art that changes in form and detail may be made without departing from the spirit and scope of the invention. For instance, the numerous details set forth herein, such as, for example, the specific embodiment of program 50 (FIG. 3) or the specific configuration of system 30 (FIG. 2), are provided to facilitate the understanding of the present invention and are not provided to limit the scope of the invention. Furthermore, sensors 20 and 21 of FIG. 1 can be positioned at any appropriate location within tester 10. Moreover, it is understood that the present method of characterizing vibrations can be used to improve the operation of any tool that requires submicron accuracy. For example, the present method can be applied to lithography alignment and lithography exposure and can also be applied to ion implantation. Accordingly, the disclosure of the present invention is not intended to be limiting. Instead, the disclosure of the present invention is intended to be illustrative of the scope of the invention, which is set forth in the following claims.

We claim:

1. A method of fabricating a component comprising the steps of:

providing a substrate;

processing the substrate by probing the substrate;

determining a presence of a vibration near the substrate during the step of processing the substrate; and re-processing the substrate when the vibration exceeds a threshold value.

2. The method of claim 1 wherein the step of determining the presence of the vibration includes measuring the vibration along a plurality of orthogonal axes.

3. The method of claim 1 wherein the step of determining the presence of the vibration includes representing the vibration as a distance in a frequency domain.

4. A method of manufacturing a semiconductor device comprising:

providing a semiconductor substrate;

providing a substrate handler having a wafer chuck;

disposing the semiconductor substrate over the substrate handler;

monitoring a vibration in the substrate handler comprising:

sensing a vibration in the substrate handler;

transforming the vibration into a voltage; and converting the voltage into a measurement of the vibration;

processing the semiconductor substrate by electrically testing at least a portion of the semiconductor substrate; and removing the semiconductor substrate from the substrate handler.

5. The method of claim 4 further comprising re-processing the semiconductor substrate when the measurement of the vibration exceeds a threshold value and wherein the step of monitoring the vibration includes monitoring the vibration during the step of processing the semiconductor substrate.

6. The method of claim 4 wherein the step of converting the voltage comprises:

using a calibration curve to convert the voltage into an acceleration of the substrate handler; and converting the acceleration of the substrate handler into a displacement of the substrate handler.

7. The method of claim 6 herein the step of converting the acceleration of the substrate handler comprises:

integrating the acceleration of the substrate handler to determine a velocity of the substrate handler; and integrating the velocity of the substrate handler to determine the displacement of the substrate handler.

8. The method of claim 4 wherein the step of monitoring the vibration includes using a computer to control the step of monitoring the vibration and wherein the step of processing the semiconductor substrate includes using the computer to control the step of processing the semiconductor substrate.

* * * * *